US008062827B2

(12) United States Patent
Kitson et al.

(10) Patent No.: US 8,062,827 B2
(45) Date of Patent: Nov. 22, 2011

(54) MULTILAYER POSITIVE-WORKING IMAGEABLE ELEMENTS AND THEIR USE

(75) Inventors: Anthony P. Kitson, Greeley, CO (US); Larisa Novoselova, Aurora, CO (US)

(73) Assignee: Eastman Kodak Company, Rochester, NY (US)

( * ) Notice: Subject to any disclaimer, the term of this patent is extended or adjusted under 35 U.S.C. 154(b) by 748 days.

(21) Appl. No.: 12/189,245

(22) Filed: Aug. 11, 2008

(65) Prior Publication Data

US 2010/0035184 A1 Feb. 11, 2010

(51) Int. Cl.
*G03F 7/00* (2006.01)
*G03F 7/26* (2006.01)

(52) U.S. Cl. ................... 430/270.1; 430/286.1; 430/302

(58) Field of Classification Search ........................ None
See application file for complete search history.

(56) References Cited

U.S. PATENT DOCUMENTS

| | | | | |
|---|---|---|---|---|
| 4,582,877 | A | 4/1986 | Fairchok et al. | |
| 6,699,636 | B2 * | 3/2004 | Savariar-Hauck | 430/270.1 |
| 6,893,783 | B2 | 5/2005 | Kitson et al. | |
| 7,049,045 | B2 | 5/2006 | Kitson et al. | |
| 7,060,415 | B2 | 6/2006 | Kitson et al. | |

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Positive-working imageable elements can be used to prepare lithographic printing plates. These elements have at least two layers (inner and outer) arranged on a suitable substrate. The inner layer that is closer to the substrate includes one or more polymeric binders that include pendant oxazoline groups and acid groups that are reactive with the oxazoline groups during a post-baking step after development. The resulting imageable elements are more quickly baked in this manner to provide improved run length and resistant to press chemicals.

17 Claims, No Drawings

MULTILAYER POSITIVE-WORKING IMAGEABLE ELEMENTS AND THEIR USE

FIELD OF THE INVENTION

This invention relates to multi-layer positive-working imageable elements having improved bakeability after they are imaged and developed. It also relates to methods of imaging and developing these imageable elements particularly to provide lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise one or more imageable layers applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers. Thermally imageable, multi-layer positive-working elements are described, for example, in U.S. Pat. No. 6,294,311 (Shimazu et al.), U.S. Pat. No. 6,352,812 (Shimazu et al.), U.S. Pat. No. 6,593,055 (Shimazu et al.), 6,352,811 (Patel et al.), and U.S. Pat. No. 6,528,228 (Savariar-Hauck et al.), and U.S. Patent Application Publication 2004/0067432 A1 (Kitson et al.).

Other positive-working single- and multi-layer imageable elements containing various unique polymeric binders are described in U.S. Pat. No. 7,049,045 (Kitson et al.), U.S. Pat. No. 7,247,418 (Saraiya et al.) and U.S. Pat. No. 7,300,726 (Patel et al.).

Various properties are desired in such positive-working imageable elements, including resistance to chemicals used during printing and long run length. This can sometimes be achieved by baking the imaged and developed element before use in printing. This "post-baking" process can be achieved at various elevated temperatures, generally greater than 150° C. and for up to 10 minutes.

For example, U.S. Pat. No. 6,893,783 (Kitson et al.), U.S. Pat. No. 7,060,415 (Kitson et al.), U.S. Pat. No. 7,186,482 (Kitson et al.), U.S. Pat. No. 7,247,418 (Saraiya et al.), U.S. Pat. No. 7,291,440 (Ray et al.), U.S. Pat. No. 7,300,726 (Patel et al.), and U.S. Pat. No. 7,338,745 (Ray et al.) describe various means for improving post-bakeability as well as resistance to press chemicals, for example by containing certain polymeric binders.

U.S. Pat. No. 6,699,636 (Savariar-Hauck) describes negative-working and positive-working lithographic imageable elements that include a polymeric binder with acidic groups and a separate crosslinking agent that contains oxazoline groups.

PROBLEM TO BE SOLVED

While many of the known positive-working imageable elements provide desired imaging and developing characteristics, there is a continuing need to improve various properties such as post-bakeability (bakeability after development) and resistance to press chemicals. For example, it would be desirable to achieve bakeability that requires shorter times or lower temperatures to achieve the desired chemical resistance and run length.

SUMMARY OF THE INVENTION

The present invention provides a positive-working, multi-layer, infrared radiation-sensitive imageable element comprising a substrate having thereon:

an inner layer comprising an infrared radiation absorbing compound and a first polymeric binder composition that is present in an amount of from about 65 to about 97 weight %, and an ink receptive outer layer comprising a second polymeric binder that is different than the first polymeric binder, and is soluble or dispersible in an alkaline developer only after exposure to imaging radiation, the first polymeric binder composition comprising either:

a) one or more polymeric binders each independently being represented by the following Structure (I):

$$-(A)_x-(B)_y—(C)_z— \qquad (I)$$

wherein A represents recurring units comprising pendant oxazoline groups, B represents recurring units comprising functional groups that are crosslinkable with the pendant oxazoline groups, C represents recurring units other than those defined by A and B, x is from about 5 to about 50 weight %, y is from about 5 to about 50 weight %, and z is from about 2 to about 90 weight %, b) one or more polymeric binders each independently being represented by the following Structure (II):

$$-(A)_m-(C)_n- \qquad (II)$$

and one or more polymeric binder each independently being represented by the following Structure (III):

$$—(B)_p—(C)_n— \qquad (III)$$

wherein A, B, and C are as defined above, and m, n, and p are independently from about 1 to about 99 weight %, wherein the weight ratio of the polymeric binder represented by Structure (II) to the polymeric binder represented by Structure (III) is from about 5:1 to about 1:5, c) one or more of each of the polymeric binders represented by Structures I, II, and III, d) one or more of each of the polymeric binders represented by Structures I and II, or e) one or more of each of the polymeric binders represented by Structures I and III.

This invention also provides a method of making an imaged element comprising:

A) imagewise exposing the imageable element of this invention to provide both exposed and non-exposed regions in the imageable element, B) developing the imagewise exposed imageable element to remove predominantly only the exposed regions, and C) optionally baking the imaged and developed element.

Thus, this method can be used to provide imaged elements, including lithographic printing plates having aluminum-containing substrates.

The present invention includes positive-working elements having multiple imageable layers (such as inner and outer imageable layers). These elements provide imaged and developed elements, such as lithographic printing plate, that exhibit improved "post-bakeability" that provides improved chemical resistance. These advantages are achieved by incorporating oxazoline groups and acidic groups in one or more of the polymeric binders used in the inner layer formulation. The acidic groups are reactive with the oxazoline groups during the baking step used after development.

DETAILED DESCRIPTION OF THE INVENTION

Definitions

Unless the context indicates otherwise, when used herein, the terms "imageable element", "positive-working imageable element", and "lithographic printing plate precursor" are meant to be references to embodiments of the present invention.

In addition, unless the context indicates otherwise, the various components described herein such as "second polymeric binder", "dissolution inhibitor", "coating solvent", "infrared radiation absorbing compound", and similar terms also refer to mixtures of such components. Thus, the use of the article "a" or "an" is not necessarily meant to refer to only a single component.

By "multi-layer" imageable element, we mean an imageable element that has at least two layers required for providing an image, for example, "inner" and "outer" layers as described below. However, such elements may comprise additional non-imaging layers on either side of the substrate.

By the term "remove predominantly only said exposed regions" during development, we mean that the exposed regions of the outermost layer and the corresponding regions of any underlying layers are selectively, preferentially, and predominantly removed by the developer.

Unless otherwise indicated, percentages refer to percents by dry weight (solids) of with a composition, formulation, or applied layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements can be used in a number of ways such as to provide lithographic printing plate as described in more detail below. However, this is not meant to be their only use. For example, the imageable elements can also be used as thermal patterning systems, chemically amplified resists, and microelectronic and microoptical devices, and to form masking elements and printed circuit boards.

Imageable Elements

In general, the imageable elements are formed by suitable application of imageable layer formulations to a suitable substrate to form one or more imageable layers. The "inner" layer formulation is applied to the substrate prior to application of the "outer" layer formulation.

The substrate is usually treated or coated in various ways as described below prior to application of the formulation. For example, it can be treated to provide an "interlayer" for improved adhesion or hydrophilicity, and the inner layer formulation is applied over the interlayer.

The substrate generally has a hydrophilic surface, or at least a surface that is more hydrophilic than the applied imageable layer formulations on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press or a sleeve that is incorporated onto a press cylinder. The use of such imaged cylinders is described for example in U.S. Pat. No. 5,713,287 (Gelbart).

In general, the multi-layer imageable elements comprise a substrate, an inner layer (also known in the art as an "underlayer"), and an outer layer (also known in the art as a "top layer" or "topcoat") disposed over the inner layer. Before thermal imaging, the outer layer is generally not soluble or dispersible in a developer within the usual time allotted for development, but after thermal imaging, the exposed regions of the outer layer are soluble or dispersible in the developer, such as a lower pH alkaline developer. The inner layer is also generally removable by the developer.

The imageable elements are formed by suitable application of an inner layer composition onto a suitable substrate (as described above). This substrate can be an untreated or uncoated support but it is usually treated or coated in various ways as described above prior to application of the inner layer composition.

The inner layer is disposed between the outer layer and the substrate. Typically, it is located directly on the substrate (including any hydrophilic coatings as described above). The inner layer comprises a first polymeric binder composition described below that is removable by the developers described below and typically soluble in the developers. In addition, the first polymeric binder composition is usually insoluble in the solvent used to coat the outer layer so that the outer layer can be coated over the inner layer without dissolving the inner layer.

The inner layer generally has a dry coating coverage of from about 0.5 to about 2.5 g/m$^2$ and typically from about 1 to about 2 g/m$^2$. The first polymeric binder composition generally comprises at least 65 weight % and up to 97 weight %, and typically from about 75 to about 90 weight % based on the total dry inner layer weight, and this amount can be varied depending upon what other polymers and chemical components are present.

The first polymeric binder composition in the inner layer includes one or more polymeric binders, at least one of which has a hydrophobic backbone to which are attached pendant oxazoline groups. The same or different polymeric binder has functional groups, such as acid groups, that are reactive with the oxazoline groups when heated above 150° C. for a sufficient time, usually at least two minutes, to provide crosslinking within the same polymeric binder or among two or more polymeric binders.

In a generic sense, the first polymeric binder composition can also be defined by the following test:

0.1 g of the first polymeric binder composition remains insoluble when agitated for 24 hours at 20° C. in an aqueous solution of 2-butoxyethanol (20% water).

In some embodiments, the first polymeric binder composition comprises one or more polymeric binders each independently being represented by the following Structure (I):

$$-(A)_x-(B)_y-(C)_z- \quad (I)$$

wherein A represents recurring units comprising pendant oxazoline groups, B represents recurring units comprising functional groups that are crosslinkable with said pendant oxazoline groups, C represents recurring units other than those defined by A and B, x is from about 5 to about 50 weight % (typically from about 10 to about 40 weight %), y is from about 5 to about 50 weight % (typically from about 10 to about 40 weight %), and z is from about 2 to about 90 weight % (typically from about 10 to about 80 weight %).

The A recurring units comprise pendant oxazoline groups that are either directly attached to the polymer backbone or are attached through an ester or amide linkage, for example as shown as follows:

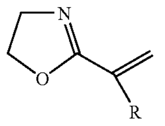

or

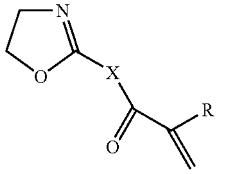

in which R is H or methyl, and X is typically —O— or —NH—. For example, the A recurring units can be derived from 2-isopropenyl-2-oxazoline.

The B recurring units comprise a pendant acid group or acid precursor group such as pendant carboxy, sulfo, and phospho groups. The best acid groups are pendant carboxy groups or their precursor such as an anhydride. For example, B recurring units can be derived from one or more of the following monomers and especially methacrylic acid:

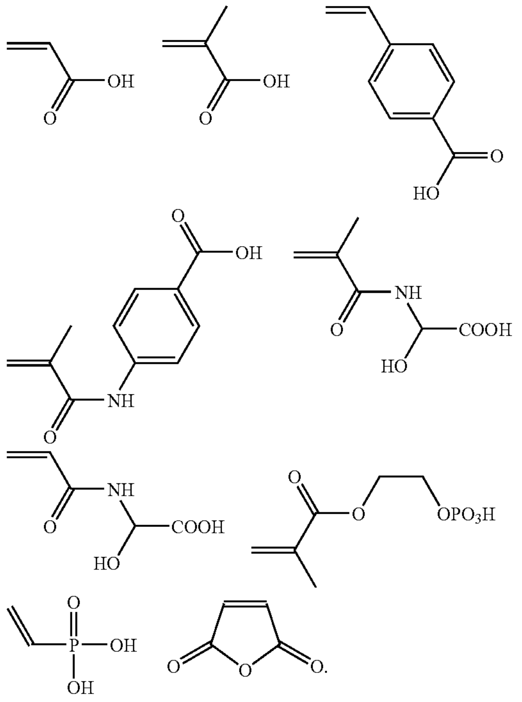

The C recurring units can be derived from one or more styrenic monomers, vinyl carbazole, (meth)acrylamides, (meth)acrylic acid esters, (meth)acrylonitriles, vinyl acetate, N-substituted phenylmaleimide, vinyl pyridine, vinyl pyrrolidone, vinyl trimethoxysilane, monomers with pendant urethane functionality, monomers with pendant urea functionality, monomers with pendant tetrazole functionality, or any combination thereof.

Other embodiments of the first polymeric binder composition include:

one or more polymeric binders each independently being represented by the following Structure (II):

$$-(A)_m-(C)_n- \quad (II)$$

and one or more polymeric binder each independently being represented by the following Structure (III):

$$-(B)_p-(C)_n- \quad (III)$$

wherein A, B, and C are as defined above, and m, n, and p are independently from about 1 to about 99 weight % (typically they are independently from about 10 to about 80 weight %). In such embodiments, the weight ratio of the polymeric binder represented by Structure (II) to the polymeric binder represented by Structure (III) is from about 5:1 to about 1:5, or typically from about 3:1 to about 1:3.

In still other embodiments, a combination of polymeric binders represented by each of Structures I, II, and III can be used, or a combination of polymeric binders represented by Structures I and II, or by Structures I and III, can be used. Multiple polymeric binders from each category can be used if desired.

The various polymeric binders useful in the first polymeric binder composition can be prepared using known starting materials and polymerization conditions, as demonstrated below for certain embodiments used in the Invention Examples. For example, various reactant ethylenically unsaturated polymerizable monomers can be obtained from various commercial sources such as Aldrich Chemical Company.

The imageable element also includes one or more infrared radiation absorbing compounds ("IR absorbing compounds") such as infrared radiation absorbing dyes ("IR dyes") that absorb radiation from about 600 to about 1200 nm and typically from about 700 to about 1200 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S. Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds also include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The infrared radiation absorbing compound is generally present in an amount of at least 0.5% and up to 30 weight % and typically from about 3 to about 20 weight % (based on total dry layer weight). The particular amount needed for this purpose would be readily apparent to one skilled in the art, depending upon the specific compound used and the properties of the alkaline developer to be used. In most embodiments, the infrared radiation absorbing compound is present in the inner layer. Alternatively or additionally, infrared radiation absorbing compounds may be located in a separate layer that is in thermal contact with the inner layer. Thus, during imaging, the action of the infrared radiation absorbing compound can be transferred to the inner layer without the compound originally being incorporated into it.

The inner layer can also include one or more additional (or secondary) binder resins other than the polymeric binders included in the first polymeric binder composition defined above. Such secondary binder resins can be with or without polar groups, or they can comprise a mixture of binder resins, some with polar groups and others without polar groups. Such secondary binder resins generally include phenolic resins such as novolak and resole resins (described below), and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.). Other useful secondary binder resins include acrylate copolymers, cellulose esters, and poly(vinyl acetals) as described for example in U.S. Pat. No. 6,391,524 (Yates et al.) and DE 10 239 505 (Timpe et al.).

Useful secondary binder resins include phenolic resins that have a multiplicity of phenolic hydroxyl groups either on the polymer backbone or on pendent groups. Novolak resins, resol resins, acrylic resins that contain pendent phenol groups, and polyvinyl phenol resins are useful phenolic resins.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Useful novolak resins are prepared by reacting m-cresol, mixtures of m-cresol and p-cresol, or phenol with formaldehyde using conditions well known to those skilled in the art.

These secondary binder resins may be present in the inner layer in an amount of from about 10 to about 80 weight % (based on total dry inner layer weight).

The inner layer may also include one or more additional polymeric binders or resins in combination with the first polymeric binder(s), which materials are generally known in the art for use in the inner layer of multi-layer imageable elements. For example, useful additional polymeric binders for the inner layer include but are not limited to, the polymeric binders described for use in the inner layers of the imageable elements described in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), U.S. Pat. No. 6,528,228 (Savariar-Hauck et al.), U.S. Pat. No. 7,049,045 (Kitson et al.), U.S. Pat. No. 7,186,482 (Kitson et al.), U.S. Pat. No. 7,144,661 (Ray et al.), U.S. Pat. No. 7,247,418 (Saraiya et al.), and U.S. Pat. No. 7,300,726 (Patel et al.), and U.S. Patent Application Publication 2004/0067432 (Kitson et al.), all incorporated herein by reference with respect to those polymeric binders.

Other useful additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Still other useful additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 and 6,528,228 (both noted above).

The inner layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The inner layer can be prepared by applying the inner layer formulation(s) over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures.

Intermediate drying steps may be used between applications of the various layer formulations to remove solvent(s) before coating other formulations. Drying steps may also help in preventing the mixing of the various layers.

The outer layer of the imageable element is disposed over the inner layer and in most embodiments there are no intermediate layers between the inner and outer layers. The outer layer comprises a second polymeric binder that is different than the polymeric binders used comprising the first polymeric binder composition described above. It typically also comprises a dissolution inhibitor or colorant. Alternatively, or additionally, a polymeric material comprising polar groups is present and acts as both the binder and dissolution inhibitor.

Any polymeric binders may be employed in the outer layer of the imageable elements if they have been previously used in outer layers of prior art multi-layer thermally imageable elements. For example, the outer layer polymeric binders can be one or more of those described in U.S. Pat. No. 6,358,669 (Savariar-Hauck), U.S. Pat. No. 6,555,291 (Hauck), U.S. Pat. No. 6,352,812 (Shimazu et al.), U.S. Pat. No. 6,352,811 (Patel et al.), U.S. Pat. No. 6,294,311 (Shimazu et al.), U.S. Pat. No. 6,893,783 (Kitson et al.), and U.S. Pat. No. 6,645,689 (Jarek), U.S. Patent Application Publications 2003/0108817 (Patel et al) and 2003/0162126 (Kitson et al.), and WO 2005/018934 (Kitson et al.).

Generally, the polymer binders in the outer layer are light-insensitive, water-insoluble, aqueous alkaline developer-soluble, film-forming phenolic resins that have a multiplicity of phenolic hydroxyl groups. Phenolic resins have a multiplicity of phenolic hydroxyl groups, either on the polymer backbone or on pendent groups. Novolak resins, resol resins, acrylic resins that contain pendent phenol groups, and polyvinyl phenol resins are useful phenolic resins.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Useful novolak resins are prepared by reacting m-cresol, mixtures of m-cresol and p-cresol, or phenol with formaldehyde using conditions well known to those skilled in the art.

A solvent soluble novolak resin is one that is sufficiently soluble in a coating solvent to produce a coating solution that can be coated to produce an outer layer. In some cases, it may be desirable to use a novolak resin with the highest weight-average molecular weight that maintains its solubility in common coating solvents, such as acetone, tetrahydrofuran, and 1-methoxypropan-2-ol. Outer layers comprising novolak resins, including for example m-cresol only novolak resins (i.e. those that contain at least about 97 mol-% m-cresol) and m-cresol/p-cresol novolak resins that have up to 10 mol-% of p-cresol, having a weight average molecular weight of at least 10,000 and typically at least 25,000, are useful. Outer layers comprising m-cresol/p-cresol novolak resins with at least 10 mol-% of p-cresol, having a weight average molecular weight of about 8,000 up to about 25,000, may also be used. In some instances, novolak resins prepared by solvent condensation may be desirable. Outer layers comprising these resins are disclosed for example in U.S. Pat. No. 6,858,359 (Kitson, et al.).

Other useful phenolic resins are poly(vinyl phenol) resins that include polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions. The weight average molecular weight ($M_w$) of these polymers is from about 1000 to about 200,000, and typically from about 1,500 to about 50,000 g/mol.

Examples of useful hydroxy-containing polymers include ALNOVOL SPN452, SPN400, HPN100 (Clariant GmbH), DURITE PD443, SD423A, SD126A (Borden Chemical, Inc.), BAKELITE 6866LB02, AG, 6866LB03 (Bakelite AG), KR 400/8 (Koyo Chemicals Inc.), HRJ 1085 and 2606 (Schenectady International, Inc.), and Lyncur CMM (Siber Hegner), all of which are described in U.S. Patent Application Publication 2005/0037280 (noted above).

The outer layer can also include non-phenolic polymeric materials as film-forming binder materials in addition to or instead of the phenolic resins described above. Such non-phenolic polymeric materials include polymers formed from an anhydride such as maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprise recurring units derived from the noted monomers as well as recurring units derived from additional, but optional monomers [such as (meth)acrylates, (meth)acrylonitrile and (meth)acrylamides]. Other hydroxy-containing polymeric binders also include heat-labile moieties as described for example in U.S. Pat. No. 7,163,777 (Ray et al.).

The polymers derived from maleic anhydride generally comprise from about 1 to about 50 mol % of recurring units derived from maleic anhydride and the remaining recurring units are derived from the styrenic monomers and optionally additional polymerizable monomers.

The polymer formed from methyl methacrylate and carboxy-containing monomers generally comprise from about 80 to about 98 mol % of recurring units derived from methyl methacrylate. The carboxy-containing recurring units can be derived, for example, from acrylic acid, methacrylic acid, itaconic acid, maleic acid, and similar monomers known in the art. Carboxy-containing polymers are described for example in U.S. Pat. No. 7,169,518 (Savariar-Hauck et al.).

The outer layer can also comprise one or more polymer binders having pendant epoxy groups sufficient to provide an epoxy equivalent weight of from about 130 to about 1000 (preferably from about 140 to about 750) as described for example in U.S. Pat. No. 7,160,653 (Huang et al.). Any film-forming polymer containing the requisite pendant epoxy groups can be used including condensation polymers, acrylic resins, and urethane resins. The pendant epoxy groups can be part of the polymerizable monomers or reactive components used to make the polymers, or they can be added after polymerization using known procedures. The outer layer can comprise one or more acrylic resins that are derived from one or more ethylenically unsaturated polymerizable monomers, at least one of which monomers comprises pendant epoxy groups.

Useful polymers of this type have pendant epoxy groups attached to the polymer backbone through a carboxylic acid ester group such as a substituted or unsubstituted —C(═O)O-alkylene, —C(═O)O-alkylene-phenylene-, or —C(═O)O-phenylene group wherein alkylene has 1 to 4 carbon atoms. Ethylenically unsaturated polymerizable monomers having pendant epoxy groups useful to make these polymer binders include glycidyl acrylate, glycidyl methacrylate, 3,4-epoxycyclohexyl methacrylate, and 3,4-epoxycyclohexyl acrylate.

The epoxy-containing polymers can also comprise recurring units derived from one or more ethylenically unsaturated polymerizable monomers that do not have pendant epoxy groups including but not limited to, (meth)acrylates, (meth)acrylamides, vinyl ether, vinyl esters, vinyl ketones, olefins, unsaturated imides (such as maleimide), N-vinyl pyrrolidones, N-vinyl carbazole, vinyl pyridines, (meth)acrylonitriles, and styrenic monomers. For example, a styrenic monomer could be used in combination with methacrylamide, acrylonitrile, maleimide, vinyl acetate, or N-vinyl pyrrolidone.

Still other useful polymeric binders for the outer layer include those having a polymer backbone and pendant sulfonamide groups such as pendant —X—C(=T)-NR—$S(=O)_2$— groups that are attached to the polymer backbone, wherein X is oxy or amido, T is oxygen or sulfur, and R is hydrogen, halo, or an alkyl group having 1 to 6 carbon atoms, as described in U.S. Pat. No. 7,163,770 (Saraiya et al.).

The polymeric binders in the outer layer can also be branched hydroxystyrene polymers that include recurring units derived from 4-hydroxystyrene, which recurring units are further substituted with repeating 4-hydroxystyrene units positioned ortho to the hydroxy groups.

The one or more polymer binders are present in the outer layer in an amount of at least 60 weight %, and typically from about 65 to about 99.5 weight %.

The outer layer generally and optionally comprises a dissolution inhibitor that functions as a solubility-suppressing component for the binder. Dissolution inhibitors generally have polar functional groups that are thought to act as acceptor sites for hydrogen bonding, such as with hydroxyl groups of the binder. Dissolution inhibitors that are soluble in the developer are most suitable. Alternatively, or additionally, the polymer binder may contain solubility-suppressing polar groups that function as the dissolution inhibitor. Useful dissolution inhibitor compounds are described for example in U.S. Pat. No. 5,705,308 (West, et al.), U.S. Pat. No. 6,060,222 (West, et al.), and U.S. Pat. No. 6,130,026 (Bennett, et al.).

Compounds that contain a positively charged (that is, quaternized) nitrogen atom useful as dissolution inhibitors include, for example, tetraalkyl ammonium compounds, quinolinium compounds, benzothiazolium compounds, pyridinium compounds, and imidazolium compounds. Representative tetraalkyl ammonium dissolution inhibitor compounds include tetrapropyl ammonium bromide, tetraethyl ammonium bromide, tetrapropyl ammonium chloride, and trimethylalkyl ammonium chlorides and trimethylalkyl ammonium bromides, such as trimethyloctyl ammonium bromide and trimethyldecyl ammonium chloride. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl)benzothiazolium cationic dyes and 3-ethyl-2-methyl benzothiazolium iodide.

Diazonium salts are useful as dissolution inhibitor compounds and include, for example, substituted and unsubstituted diphenylamine diazonium salts, such as methoxy-substituted diphenylamine diazonium hexafluoroborates. Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenylamine and triphenylamine.

Keto-containing compounds useful as dissolution inhibitor compounds include, for example, aldehydes, ketones, especially aromatic ketones, and carboxylic acid esters. Representative aromatic ketones include xanthone, flavanones, flavones, 2,3-diphenyl-1-indenone, 1'-(2'-acetonaphthonyl) benzoate, 2,6-diphenyl-4H-pyran-4-one and 2,6-diphenyl-4H-thiopyran-4-one. Representative carboxylic acid esters include ethyl benzoate, n-heptyl benzoate, and phenyl benzoate.

Other readily available dissolution inhibitors are triarylmethane dyes, such as ethyl violet, crystal violet, malachite green, brilliant green, Victoria blue B, Victoria blue R, Victoria blue BO, BASONYL Violet 610. These compounds can also act as contrast dyes that distinguish the non-exposed regions from the exposed regions in the developed imageable element.

When a dissolution inhibitor compound is present in the outer layer, it typically comprises at least about 0.1 weight %, more generally from about 0.5 to about 30 weight % or from about 1 to about 15 weight %, based on the dry weight of the outer layer.

Alternatively, or additionally, the polymer binder in the outer layer can comprise polar groups that act as acceptor sites for hydrogen bonding with the hydroxy groups present in the polymeric material and, thus, act as both the binder and dissolution inhibitor. These derivatized polymeric materials can be used alone in the outer layer, or they can be combined with other polymeric materials and/or solubility-suppressing components. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically from about 0.5 mol % to about 5 mol % of the hydroxyl groups will be derivatized.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolak resin in which from about 1 to about 3 mol % of the hydroxyl groups has been converted to phenyl sulfonate or p-toluene sulfonate (tosyl) groups.

Another group of polymeric materials that comprise polar groups and function as dissolution inhibitors are derivatized phenolic resins that contain the diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Derivatization of phenolic resins with compounds that contain the diazonaphthoquinone moiety is known in the art and is described, for example, in U.S. Pat. Nos. 5,705,308 and 5,705,322 (both West, et al.). An example of a resin derivatized with a compound that comprises a diazonaphthoquinone moiety is P-3000 (available from PCAS, France) that is a naphthoquinone diazide of a pyrogallol/acetone resin.

To reduce ablation during imaging with infrared radiation, the outer layer is generally substantially free of radiation absorbing compounds, meaning that none of those compounds are purposely incorporated therein and insubstantial amounts diffuse into it from other layers. Thus, any radiation absorbing compounds in the outer layer absorb less than about 10% of the imaging radiation, typically less than about 3% of the imaging radiation, and the amount of imaging radiation absorbed by the outer layer, if any, is not enough to cause ablation of the outer layer.

The outer layer can also include other components such as coating surfactants, dispersing aids, humectants, biocides, viscosity builders, drying agents, antifoaming agents, preservatives, antioxidants, colorants, and contrast dyes.

The outer layer generally has a dry coating coverage of from about 0.2 to about 2 $g/m^2$ and typically from about 0.4 to about 1 $g/m^2$.

There may be a separate layer that is disposed between the inner and outer layers. This separate layer (or interlayer) can act as a barrier to minimize migration of radiation absorbing compounds from the inner layer to the outer layer. This interlayer generally comprises a polymeric material that is soluble in an alkaline developer. A useful polymeric material of this type is a poly(vinyl alcohol).

Alternatively, there may be a separate layer between the inner and outer layers than contains the infrared radiation absorbing compound(s), which may also be present in the inner layer, or solely in the separate layer.

Preparation of Imageable Elements

The multi-layer imageable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

For example, a multi-layer imageable element can be prepared with an inner layer comprising a first polymeric binder composition (as described above) and a radiation absorbing compound, and an ink receptive outer layer comprising a second polymeric binder that: (1) is different than the first polymeric binder composition, and (2) is soluble or dispersible in an alkaline developer upon exposure to imaging radiation.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, a mixture of dioxolane, PGME, BLO, and water, a mixture of dimethylacetamide, BLO, and water, or a mixture of methyl lactate, methanol, and dioxolane.

The outer layer formulation can be coated out of solvents or solvent mixtures that do not dissolve the inner layer. Typical solvents for this purpose include but are not limited to, acetone, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, a mixture of DEK and acetone, a mixture of 1-methoxy-2-propanol acetate (PGMEA) and DEK, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil or web.

Imaging and Development

The imageable elements can have any useful form including, but not limited to, printing plate precursors, printing cylinders, printing sleeves (solid or hollow cores) and printing tapes (including flexible printing webs). For example, the imageable members can be lithographic printing plate precursors useful for providing lithographic printing plates having hydrophilic substrate surfaces.

Printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

During use, the imageable elements are exposed to a suitable source of radiation such as infrared radiation, depending upon the infrared radiation absorbing compound present in the element, for example at a wavelength of from about 600 to about 1500 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 $mJ/cm^2$, and typically from about 75 to about 400 $mJ/cm^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable developer removes predominantly only the exposed regions of the outer layer and the underlying portions of underlayers (including the inner layer), and reveals the hydrophilic surface of the substrate. Thus, the imageable elements are "positive-working" (for example, positive-working lithographic printing plate precursors). The revealed regions of the hydrophilic surface repel ink while the non-exposed regions of the outer layer accept ink.

The imaged elements are generally developed using conventional processing conditions using a suitable alkaline developers described below. Some developers generally have a pH of 13 or less and typically from about 7 to about 13, or from about 7 to about 12.5. In some embodiments, development is carried out using a lower pH developer that has a pH of from about 7 to about 12 and comprises benzyl alcohol, 2-phenoxyethanol, or both.

Some useful developers are generally single-phase solutions of water and one or more organic solvents that are miscible with water. Useful organic solvents can contain the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, or ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative developers useful in this invention include but are not limited to, SW-D1 Developer, ND-1 Developer, 955 Developer, 956 Developer, 989 Developer, and 980 Developer (all available from Eastman Kodak Company), HDN-1 Developer (available from Fuji), and EN 232 Developer (available from Agfa).

Other useful alkaline developers may have somewhat higher pH than the organic solvent-containing developers, for example, a pH of from about 8 to about 14 and more typically of from about 12 to about 14. Useful alkaline aqueous developers include 3000 Developer, 9000 Developer, GoldStar® Developer, Goldstar® Plus Developer, GoldStar® Premium, GREENSTAR Developer, ThermalPro Developer, PROTHERM Developer, MX1813 Developer, and MX1710 Developer (all available from Eastman Kodak Company), as well as Fuji HDP7 Developer (Fuji Photo) and Energy CTP Developer (Agfa). These compositions generally include surfactants, chelating agents (such as salts of ethylenediaminetetraacetic acid), and alkaline components (such as inorganic metasilicates, organic metasilicates, hydroxides, and bicarbonates).

Such highly alkaline developers can also include one or more "coating-attack suppressing agents" that are developer-soluble compounds that suppress developer attack of the outer layer. "Developer-soluble" means that enough of the agent(s) will dissolve in the developer to suppress attack by the developer. Mixtures of these compounds can be used. Typically, the coating-attack suppressing agents are developer-soluble polyethoxylated, polypropoxylated, or polybutoxylated compounds that include recurring $—(CH_2—CHR_a—O—)—$ units in which $R_a$ is hydrogen or a methyl or ethyl group. Each agent can have the same or different recurring units (in a random or block fashion). Representative compounds of this type include but are not limited to, polyglycols and polycondensation products having the noted recurring units. Examples of such compounds and representative sources, tradenames, or methods of preparing are described for example in U.S. Pat. No. 6,649,324 (Fiebag et al.) that is incorporated herein by reference.

Generally, the developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element can be immersed in the developer. In all instances, a developed image is produced, particularly in a lithographic printing plate.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. In some embodiments, the imaged and developed element is baked at a temperature of from about 150 to about 250° C. for from about 1 to about 10 minutes. For example, the baking can be carried out at a temperature of up to 210° C. for up to 2 minutes.

A lithographic ink and fountain solution can be applied to the printing surface of the imaged element for printing. The non-exposed regions of the outermost layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The following materials were used in the preparation and practice of these examples:

MLR36 is a copolymer of N-phenylmaleimide/methacrylamide/methacrylic acid/acrylonitrile/styrene/ethylene glycol methacrylate phosphate, 12/33/12/34/6/3 mol ratio.

Polymer APK93: All materials for the polymer synthesis were obtained from Aldrich Chemical Co. (Milwaukee, Wis.).

1,3-Dioxolane (58.8 g), water (14.7 g), 2-isopropenyl-2-oxazoline (5.1 g), methacrylic acid (3.16 g), and N-phenylmaleimide (6.36 g) were added to a 500 ml 4-neck ground glass flask, equipped with a heating mantle, thermometer, mechanical stirrer, condenser, pressure equalized addition funnel and nitrogen inlet. The reaction mixture was heated to 65° C. under nitrogen atmosphere. A mixture of 1,3-dioxolane (32.0 g), water (8.0 g), acrylonitrile (1.46 g), methacrylamide (3.91 g), and AIBN (0.04 g) were added over a period of two hours. The reaction was continued for another 22 hours with additional additions of AIBN (0.04 g) at 8 and 16 hours. The product was isolated in water and ice and dried to constant weight at 40° C. Polymer yield was 11 g.

Polymer APK99:

1,3-Dioxolane (97.48 g), water (24.3 g), 2-isopropenyl-2-oxazoline (5.5 g), methacrylic acid (7.09 g), and N-phenylmaleimide (5.71 g) were added to a 500 ml 4-neck ground glass flask, equipped with a heating mantle, thermometer, mechanical stirrer, condenser, pressure equalized addition funnel and nitrogen inlet. The reaction mixture was heated to 65° C. under nitrogen atmosphere. A mixture of 1,3-dioxolane (40.0 g), water (10.0 g), acrylonitrile (4.37 g), methacrylamide (5.61 g), styrene (1.72 g), and AIBN (0.30 g) were added over a period of two hours. The reaction was continued for another 22 hours with additional additions of AIBN 0.30 g at 8 and 16 hours. The product was isolated in water and ice and dried to constant weight at 40° C. Polymer yield was 23 g.

IR dye A was Kayasorb PS210CNE that is an infrared absorbing dye as supplied by Nippon Kayaku Co, Ltd. (Tokyo, Japan).

IR dye B was KF654 as supplied by Honeywell, N.J.

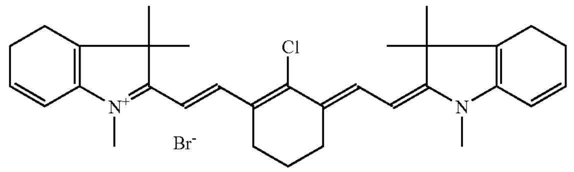

BYK® 307 is a polyethoxylated dimethylpolysiloxane as supplied by BYK Chemie of Wallingford, Conn.

BLO represents γ-butyrolactone.

Crystal violet is a violet dye C.I. 42555; CAS 548-62-9; $[(p-(CH_3)_2NC_6H_4)_3C^+Cl^-]$.

D11 is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France).

DEK represents diethyl ketone.

Dow Additive 19 is a silicone additive (10% in DEK) available from Dow Corning (Midland, Mich.).

PGME represents 1-methoxypropan-2-ol (or Dowanol® PM).

PGMEA represents 1-methoxy-2-propanol acetate.

RX-04 is a copolymer of styrene and maleic anhydride, available form Gifu Shellac (Japan).

Substrate A was a 0.3 mm gauge aluminum sheet, electrograined, anodized and subject to treatment with poly(vinyl phosphonic acid).

SW-D1 is a developer solution available from Kodak Graphic Communications Japan LTD.

Inner layer Solution C1:

| | |
|---|---|
| Solvent 1: (dioxolane/PGME/BLO/water 50/30/10/10 wt. %) | 14.748 g |
| MLR36 | 0.892 g |
| IR Dye A | 0.129 g |
| D11 (1% solution in solvent 1) | 0.803 g |
| Dow Additive 19 (10% in DEK) | 0.321 g |
| BYK ® 307 (10% solution in DEK) | 0.107 g |

Inner Layer Solution 2:

| | |
|---|---|
| Solvent 2: (dimethylacetamide/BLO/water 80/10/10 wt. %) | 14.748 g |
| APK93 | 0.892 g |
| IR Dye B | 0.129 g |
| D11 (1% solution in solvent 2) | 0.803 g |
| Dow Additive 19 (10% in DEK) | 0.321 g |
| BYK ® 307 (10% solution in DEK) | 0.107 g |

Inner Layer Solution 3:

| | |
|---|---|
| Solvent 1: (Dioxolane/PGME/BLO/water 50/30/10/10 wt. %) | 14.748 g |
| APK99 | 0.892 g |
| IR Dye A | 0.129 g |
| D11 (1% solution in solvent 1) | 0.803 g |
| Dow Additive 19 (10% in DEK) | 0.321 g |
| BYK ® 307 (10% solution in DEK) | 0.107 g |

Inner Layer Solution 4:

| | |
|---|---|
| Solvent 1: (Dioxolane/PGME/BLO/water 50/30/10/10 wt. %) | 14.748 g |
| APK99 | 0.892 g |
| IR Dye B | 0.129 g |
| D11 (1% solution in solvent 1) | 0.803 g |
| Dow Additive 19 (10% in DEK) | 0.321 g |
| BYK ® 307 (10% solution in DEK) | 0.107 g |

Upper Layer Solution:

| | |
|---|---|
| RX-04 | 3.96 g |
| Crystal violet | 0.012 g |
| BYK ® 307 (10% solution in DEK) | 0.28 g |
| Solvent: (DEK/PGMEA 92/8 wt. %) | 75.748 g |

Imageable Element C1 (Comparison):

A two-layer, heat-mode lithographic printing plate precursor was produced according to the following method:

Inner Layer Solution C1 was applied to Substrate A with a 0.012 inch (0.03 cm) wire-wound bar to provide a dry coating weight of approximately 1.35 g/m$^2$. The coating was dried for 35 seconds at 120° C. The Upper Layer solution was applied using a 0.006 inch (0.015 cm) wire-wound bar and dried for 35 seconds at 120° C. to provide a dry coat weight of about 0.45 g/m$^2$.

Imageable Element 2: The same coating procedure was used as for Imageable Element C1, except that inner layer Solution 2 was used.

Imageable Element 3: The same coating procedure was used as for Imageable Element C1, except that inner layer Solution 3 was used.

Imageable Element 4: The same coating procedure was used as for Imageable Element C1, except that inner layer Solution 4 was used.

Inner Layer C1: The same coating procedure was used as for Imageable Element C1, except that no outer layer solution was applied.

Inner Layer 2: The same coating procedure was used as for Imageable Element 2, except that no outer layer solution was applied.

Inner Layer 3: The same coating procedure was used as for Imageable Element 3, except that no outer layer solution was applied.

Inner Layer 4: The same coating procedure was used as Imageable Element 4, except that no outer layer solution was applied.

Invention Examples 1-3

Imaging Test: Imageable Elements C1, 2, 3, and 4 were imaged on a Screen PTR4300 using an internal test pattern that was applied at powers of 35-85% with increments of 5%. The drum speed was set to 1000 rpm. The imaged elements were processed by soaking them for 30 seconds in a suitable dilution of SW-D1 developer, followed by a light rinse with water. The resulting printing plates were evaluated for development time, the exposure power required to give a clean image and the exposure power required to give best image reproduction. The following Table I shows the resulting data.

TABLE I

| Example | Element | SW-D1:water Ratio | Exposure - Cleanout | Exposure - Best Reproduction | Comments |
|---|---|---|---|---|---|
| Comparative | C1 | 1:5 | 55% | 65% | Good resolution, low exposure |
| Invention 1 | 2 | 1:5 | 55% | 65% | Good resolution, low exposure |
| Invention 2 | 3 | 1:8 | 55% | 65% | Good resolution, low exposure |
| Invention 3 | 4 | 1:10 | 55% | 65% | Good resolution, low exposure |

TABLE III

| Inner Layer | Percent of coating removed in 2 minutes: DAA/water (80/20) | BC/water (80/20) |
|---|---|---|
| C1 | 20 | 2 |
| 2 | 5 | 5 |
| 3 | 25 | 10 |
| 4 | 25 | 10 |

Invention Examples 4-7

Printing Test: The lithographic plates obtained from Imageable Elements C1, 2, 3 and 4 described above were mounted directly onto an A.B. Dick 9870 Duplicator Press (A.B. Dick, Niles, Ill., USA). The press was charged Van Son Rubber Base black Ink (Van Son Ink, Mineola, N.Y., USA). The aqueous fountain solution contained about 23.5 ml/l (3 oz per gallon) Varn Litho Etch142W (Varn International, Addison, Ill., USA), and about 23.5 ml/l (3 oz per gallon) Varn PAR (alcohol substitute) in water. The printing plates were wiped with a non-abrasive rag soaked with fountain solution. The printing press was started and the damping system was engaged to further wet the plate with fountain solution. After a few revolutions, the inking system was engaged and 200 copies were printed. The printed sheets were assessed for number of sheets needed to print a clean background and the number of sheets to get to a full ink density. The results are shown below in TABLE II.

TABLE II

| Example | Imageable Element | # Sheets to print Clean Background | # Sheets to get to full ink Density |
|---|---|---|---|
| Invention 4 | C1 | 1 | 5 |
| Invention 5 | 2 | 1 | 5 |
| Invention 6 | 3 | 1 | 5 |
| Invention7 | 4 | 1 | 5 |

Resistance to UV Wash:

Drops of diacetone alcohol/water (4:1) were placed on the inner layer formulations C1, 2, 3, and 4 at 1-minute intervals up to 10 minutes, and then washed off with water. An estimation of the amount of coating removed after 2 minutes was recorded. In addition, drops of Butyl Cellosolve (BC)/water (4:1) were placed on the inner layer formulations C1, 2, 3, and 4 at 1-minute intervals up to 10 minutes and rinsed off with water. An estimation of the amount of coating removed after 2 minutes was recorded. The results of these tests are provided in the following TABLE III.

All of the inner layer formulations were considered to have a good degree of chemical resistance.

Baking Test:

Coated inner layer formulations C1-4 were baked in a Mathis Labdrier at 230° C. for 8 minutes with a fan speed of 1000 rpm. Positive image remover, PE3S (available from Kodak Polychrome Graphics, Japan Ltd) was applied at 1-minute intervals up to 10 minutes and rinsed off with water. The coating was considered to be 100% bakeable if the positive image remover was unable to remove any coating. The coating was considered to be 50% bakeable if 50% of the coating was removed. The test was then repeated by baking at 230° C. for 2 minutes, 210° C. for 2 minutes, and 190° C. for 2 minutes. The results are shown below in TABLE IV.

TABLE IV

| Inner Layer | Bakeability (100% = 100% Bakeable, 0% = Not Bakeable): 190° C., 2 min. | 210° C., 2 min. | 230° C., 2 min. | 230° C., 8 min. |
|---|---|---|---|---|
| C1 | 0% | 0% | 10% | 20% |
| 2 | 70% | 100% | 100% | 100% |
| 3 | 50% | 100% | 100% | 100% |
| 4 | 50% | 100% | 100% | 100% |

Inner Layer formulation C1 did not contain a polymeric binder with pendant oxazoline groups and was much less bakeable than inner layer formulations 2, 3, and 4 containing polymeric binders having such groups.

The invention has been described in detail with particular reference to certain preferred embodiments thereof, but it will be understood that variations and modifications can be effected within the spirit and scope of the invention.

The invention claimed is:

1. A positive-working, multi-layer, infrared radiation-sensitive imageable element comprising a substrate having thereon:

an inner layer comprising an infrared radiation absorbing compound and a first polymeric binder composition that is present in an amount of from about 65 to about 97 weight %, and an ink receptive outer layer comprising a second polymeric binder that is different than said first polymeric binder, and is soluble or dispersible in an alkaline developer only after exposure to imaging radiation, said first polymeric binder composition comprising either:

a) one or more polymeric binders each independently being represented by the following Structure (I):

$$-(A)_x-(B)_y-(C)_z- \quad (I)$$

wherein A represents recurring units comprising pendant oxazoline groups, B represents recurring units comprising functional groups that are crosslinkable with said pendant oxazoline groups, C represents recurring units other than those defined by A and B, x is from about 5 to about 50 weight %, y is from about 5 to about 50 weight %, and z is from about 2 to about 90 weight %, b) one or more polymeric binders each independently being represented by the following Structure (II):

$$-(A)_m-(C)_n- \quad (II)$$

and one or more polymeric binder each independently being represented by the following Structure (III):

$$-(B)_p-(C)_n- \quad (III)$$

wherein A, B, and C are as defined above, and m, n, and p are independently from about 1 to about 99 weight %, wherein the weight ratio of the polymeric binder represented by Structure (II) to the polymeric binder represented by Structure (III) is from about 5:1 to about 1:5, c) one or more of each of the polymeric binders represented by Structures I, II, and III, d) one or more of each of the polymeric binders represented by Structures I and II, or e) one or more of each of the polymeric binders represented by Structures I and III.

2. The element of claim 1 wherein the A recurring units comprise pendant oxazoline groups that are either directly attached to the polymer backbone or are attached through an ester or amide linkage.

3. The element of claim 1 wherein said B recurring units comprise a pendant acid group or acid precursor group.

4. The element of claim 3 wherein said B recurring units comprises a pendant carboxy group.

5. The element of claim 1 wherein C represents recurring units derived from one or more styrenic monomers, vinyl carbazole, (meth)acrylamides, (meth)acrylic acid esters, (meth)acrylonitriles, vinyl acetate, N-substituted phenylmaleimide, vinyl pyridine, vinyl pyrrolidone, vinyl trimethoxysilane, monomers with pendant urethane functionality, monomers with pendant urea functionality, monomers with pendant tetrazole functionality, or any combination thereof.

6. The element of claim 1 wherein x is from about 10 to about 40 weight %, y is from about 10 to about 40 weight %, z is from about 10 to about 80 weight %, and m, n, and p are independently from about 10 to about 80 weight %.

7. The element of claim 1 wherein 0.1 g of said first polymeric binder composition remains insoluble when agitated for 24 hours at 20° C. in an aqueous solution of 2-butoxyethanol (20% water).

8. The element of claim 1 wherein said infrared radiation absorbing compound is an IR dye.

9. The element of claim 1 wherein said outer layer comprises a second polymeric binder that comprises either: a $-X-C(=T)-NR-S(=O)_2-$ moiety wherein X is oxy or NR", T is oxygen or sulfur, and R and R" are independently hydrogen, halo, or an alkyl group having 1 to 6 carbon atoms, or an anhydride group.

10. The element of claim 1 that is a lithographic printing plate precursor having an aluminum-containing substrate.

11. A method of making an imaged element comprising:

A) imagewise exposing the imageable element of claim 1 to provide both exposed and non-exposed regions in said imageable element, B) developing said imagewise exposed imageable element to remove predominantly only said exposed regions, and C) optionally baking said imaged and developed element.

12. The method of claim 11 wherein said developing is carried out using a developer that has a pH of from about 7 to about 12 and comprises benzyl alcohol, 2-phenoxyethanol, or both.

13. The method of claim 11 wherein said imagewise exposure is carried out using infrared radiation.

14. The method of claim 11 wherein said imaged and developed element is baked at a temperature of from about 150 to about 250° C. for from about 1 to about 10 minutes.

15. The method of claim 14 wherein said imaged and developed element is baked at a temperature of up to 210° C. for up to 2 minutes.

16. The method of claim 11 wherein 0.1 g of said first polymeric binder composition in said inner layer of said imageable element remains insoluble when agitated for 24 hours at 20° C. in an aqueous solution of 2-butoxyethanol (20% water).

17. The method of claim 11 that provides a lithographic printing plate having an aluminum-containing substrate.

* * * * *